United States Patent Office 3,474,302

Patented Oct. 21, 1969

3,474,302

SEMICONDUCTOR DEVICE PROVIDING HERMETIC SEAL AND ELECTRICAL CONTACT BY SPRING PRESSURE

Alan John Blundell, Willoughby, near Rugby, England, assignors to Associated Electrical Industries Limited, London, England, a British company Filed May 4, 1966, Ser. No. 547,585
Claims priority, application Great Britain, May 7, 1965, 19,312/65
Int. Cl. H01l 3/00, 5/00
U.S. Cl. 317—234 7 Claims

ABSTRACT OF THE DISCLOSURE

A semiconductor device comprising a semiconductor element held by spring pressure in solderless electrical contact between two conductive parts, the spring pressure also being used to form a pressure seal to complete a sealed enclosure for the element.

This invention relates to the construction of semiconductor devices, with especial application to such devices intended to handle relatively high powers, such as so-called power rectifiers and thyristors.

In such semiconductor devices it is usual to seal the semiconductor element in some way in order to prevent ingress of moisture or contamination. This sealing may be achieved by encapsulation in a potting resin or settable rubber, but the seals thus obtained may not be truly hermetic because of the difficulty in obtaining a satisfactory bond between the encapsulating material and metal parts of the device.

Another technique is to obtain a seal by clamping metal parts together (if necessary with an intervening insulating member) but here there is the difficulty of maintaining the seal under conditions of varying temperature and ageing of parts.

Sealing by enclosure in a metal/ceramic casing (with the final seal usually made by welding or soldering) is also possible, but this tends to increase the overall size of the device, in addition to presenting the problem of providing good metal-to-ceramic seals.

Because of problems arising due to differential thermal expansion when electrical and thermal contact with the semiconductor element is made within the device by soldering, it is known to achieve this contact in a solderless manner by urging the relevant surfaces together under firm spring pressure.

According to the present invention, a semiconductor device comprises a semiconductor element; a first conductive part abutting one face of the element; a sealing membrane in sealed relationship with said first conductive part; a second conductive part abutting an opposite face of the element; and spring means acting on said second conductive part through said sealing membrane, providing pressure for a solderless electrical contact between at least one of said conductive parts and said element, and also forming a hermetic pressure seal between said membrane and said second conductive part thereby completing a sealed enclosure for said element, constituted by said membrane and said first and second conductive parts. The membrane either may also be sealed to the first conductive part by the spring pressure, or it may be formed integrally with this first conductive part.

Figure 1:
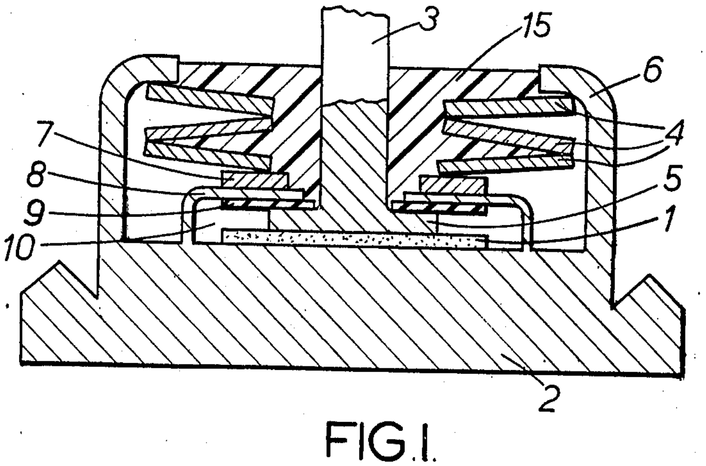
Figures 2, 2A:
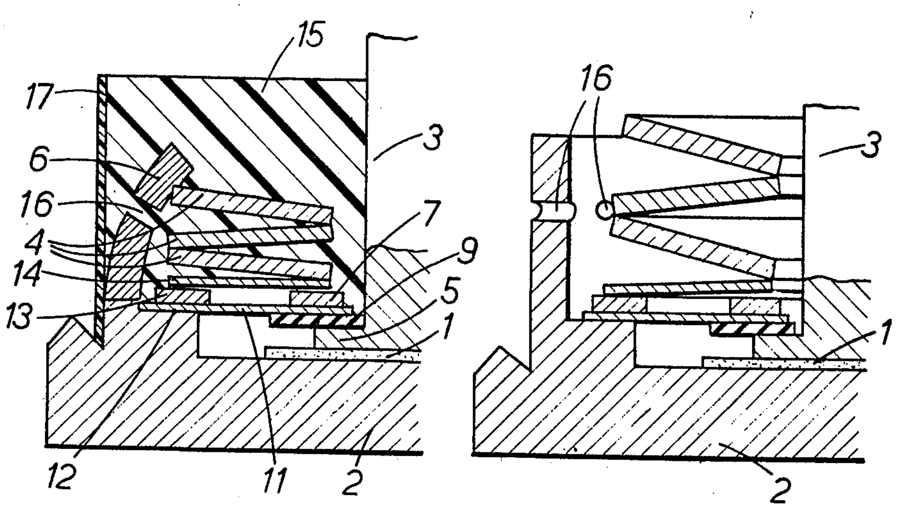

The nature of the invention may be more fully understood by reference to the accompanying drawings in which FIGS. 1 and 2 are cross-sectional illustrations of respective embodiments (FIG. 2 being a half section) and FIG. 2*a* illustrates an intermediate stage in the manufacture of the FIG. 2 embodiment.

In FIGS. 1 and 2 the semiconductor element is indicated at 1 and comprises a wafer of semiconductor material having zones of different conductivity or different conductivity types forming the requisite number and types of junctions according to the type of device, for instance rectifier (two-zone) or thyristor (four-zone). The zones to which contact is to be made may in known manner be provided with surface layers of contact material, for example of gold or silver foil.

The semiconductor element 1 is compressed by spring pressure between a relatively massive metallic base member 2 and the flanged end of a metallic rod 3, possibly with an intervening layer or layers of conductive material (such as molybdenum) having a coefficient of thermal expansion similar to that of the semiconductor material of the element 1, and possibly also with layers of contact material such as gold or silver between such layers and the parts 2 and 3. The parts 2 and 3 (of which the rod 3 is shown as solid but may if desired be hollow for reasons to be indicated later) constitute the main (anode and cathode terminal connections of the device, and the necessary electrical contact between them and the element 1 is achieved by the spring pressure. The spring pressure also achieves good thermal contact especially between the element 1 and the massive base 2, which being made of copper or other such metal of good thermal conductivity serves to convey heat away from the element 1.

The spring pressure is applied by means of spring washers 4, preferably of the Belleville type, compressed between the rear surface of the flange 5 on the rod 3 and a retaining annular part 6 formed integrally with the base 2 and spun or swaged over the periphery of the outer spring washer as indicated.

Between the inner spring washer 4 and the flanges 5 in the FIG. 1 embodiment are interposed a pressure equalising washer 7, a sealing membrane 8 and an insulating ring 9. The membrane 8 is constituted by a relatively thin cylindrical part formed integrally with the base 2 and spun over or otherwise caused to overlap the rear of the flange 5 round its entire periphery, with the insulating ring 9 intervening. The action of the spring washers 4 produces a pressure seal between the membrane 8 and the insulating ring 9, and also between this ring 9 and the rear of the flange 5: consequently a sealed enclosure 10 is formed for the semiconductor element 1.

The FIG. 2 embodiment utilises a sealing membrane 11 provided as a separate component in the form of a flat annulus. This membrane is interposed as before between a pressure equalising washer 7 and an insulating ring 9 through which the spring washers 4 act on the rear of the flange 5. In this case however the membrane 11 is also pressed into sealing contact with a flat ledge 12 on the base 2. This is achieved through the intermediary of a second pressure equalising washer 13 by a further spring washer 14 which is also interposed between the pressure equalising washer 7 and the adjacent spring washer 4. The spring washer 14 shares the total spring loading between the two equalising washers 7 and 13. FIG. 2*a* shows the spring washers 4 and 14 in their unstressed condition. Suppose that washer 4 exerts a force of 200 lbs. when flat and that the washers 14 exert a force of 400 lbs. when nearly flat. On compression of the spring washers, the washer 4 will collapse until, when it is just touching the inner equalising washer 7, it is exerting a force of 200 lbs. on the outer equalising washer 13 but zero force on washer 7. Further compression of the spring washers 4 does not increase the force on washer 13 but progressively increases the force on the washer 7. When they are exerting their 400 lb. force, the force on the washer 7 will have risen to 200 lbs., that is, equal to the force on the washer 13.

In both embodiments the seal can be improved by the addition of a sealing compound or grease at both surfaces of the insulating ring 9, and the effect of this can be further enhanced by forming an annular groove for the compound or grease on each of these surfaces or on the facing surfaces on the flange 5 or member 11 as the case may be. To provide mechanical strength and also to weather-proof the external edge of the seal, the space left by the washers 4 around the terminal rod 3 may be filled with a potting resin or rubber 15 such as not to interfere with the action of the spring washers: for instance the space may be filled with successive layers of progressively less resilient resin, the outer layer being substantially rigid. If it is desired that the potting material 15 shall also embed the internal edge of the seal in the FIG. 2 embodiment, requiring that this material shall penetrate to the space between the washers 4 and the retaining part 6, this may be achieved by forming suitably positioned holes or gaps in the assembly, either in the washers or in the retaining part: thus for the FIG. 2 embodiment the retaining part 6 is shown as being embedded in the potting material 15 and as having a series of openings such as 16 (see FIG. 2*a*) which permit the potting material to penetrate through it, the potting material at the exterior of the part 6 being contained by an insulating tube 17 slipped over this part prior to potting.

In the case of a device (such as a thyristor) requiring more than two connection to the semiconductor element, the additional connection or connections can be taken in a suitably sealed manner through the base member 2 or through the conductive rod 3. The latter possibility is the more attractive especially in the case of a thyristor device in which, in accordance with our British Patent No. 869,680, the semiconductor element has one of its main (outer) zones in an annular form with its control or trigger zone accessible through the central aperture of this annular zone: in such case the connection rod 3 could be tubular with its flange 5 contacting the annular zone of the semiconductor element and with a trigger connection extending co-axially within the tubular rod 3 to contact the centrally accessible control zone.

What I claim is:

1. A semiconductor device comprising a semiconductor element; first and second conductor parts abutting opposite faces of the element, a sealing membrane in sealed relationship with said first conductive part, a portion of said membrane extending to a point adjacent the second conductive part, and spring means acting on said second conductive part through said portion of the sealing membrane, providing both:

(a) pressure for a solderless contact between at least one of said conductive parts and said element, and (b) pressure for forming a hermetic seal between said portion of the membrane and said conductive part, completing a hermetically sealed enclosure for said element, said enclosure constituted by said membrane and said first and second conductive parts.

2. A device as claimed in claim 1 wherein the membrane is sealed to said first conductive part also by the spring pressure.

3. A device as claimed in claim 1 wherein the membrane is of annular disc form and is pressed by the spring means against two coplanar annular surfaces provided respectively by the two said conductive parts with insulation between the membrane and at least one of said parts.

4. A device as claimed in claim 3 wherein the spring means comprises a plurality of superimposed Belleville-type spring washers, and pressure-equalizing washers are interposed between the membrane and the inner and outer peripheries of the Belleville-type washer adjacent to the membrane.

5. A device as claimed in claim 1 wherein the membrane is formed integrally with said first conductive part.

6. A device as claimed in claim 5 wherein the membrane is constituted by a relatively thin cylindrical wall which extends from a portion of said first conductive part on which the semiconductor element is mounted, encircles the element, and terminates in an annular portion which is pressed by the spring means against an annular surface provided by said second conductive part, with insulation between the membrane and said annular surface.

7. A device as claimed in claim 6 wherein the spring means comprises a plurality of superimposed Belleville-type spring washers and a pressure-equalizing washer is interposed between the membrane and the periphery of the Belleville-type washer adjacent to and acting on the membrane.

References Cited

UNITED STATES PATENTS

| | | | |
|---|---|---|---|
| 3,396,316 | 8/1968 | Wislocky | 317—234 |
| 3,252,060 | 5/1966 | Marino et al. | 317—234 |

JAMES D. KALLAM, Primary Examiner

B. ESTRIN, Assistant Examiner

U.S. Cl. X.R.

317—235